United States Patent
Burnside et al.

(10) Patent No.: US 7,370,300 B2
(45) Date of Patent: May 6, 2008

(54) SYSTEMS AND METHODS OF SIMULATING SIGNAL COUPLING

(75) Inventors: Clark D. Burnside, Fort Collins, CO (US); Clinton H. Parker, Fort Collins, CO (US); Dacheng Zhou, Fort Collins, CO (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 408 days.

(21) Appl. No.: 10/984,245

(22) Filed: Nov. 9, 2004

(65) Prior Publication Data

US 2006/0101360 A1 May 11, 2006

(51) Int. Cl.
*G06F 17/50* (2006.01)

(52) U.S. Cl. .................. 716/6; 716/1; 716/4; 716/5; 703/14; 703/15; 703/16

(58) Field of Classification Search ........... 716/1–18; 714/817, 819; 703/2, 14–16; 327/365, 382
See application file for complete search history.

(56) References Cited

U.S. PATENT DOCUMENTS

| | | | | |
|---|---|---|---|---|
| 5,481,695 A | * | 1/1996 | Purks .................. | 703/15 |
| 5,568,395 A | * | 10/1996 | Huang ................. | 716/4 |
| 5,900,766 A | * | 5/1999 | Naffziger et al. ..... | 327/382 |
| 6,253,359 B1 | | 6/2001 | Cano et al. | |
| 6,389,581 B1 | * | 5/2002 | Muddu et al. ........ | 716/6 |
| 6,405,348 B1 | * | 6/2002 | Fallah-Tehrani et al. | 716/4 |
| 6,433,648 B1 | | 8/2002 | Lee | |
| 6,478,584 B2 | | 11/2002 | Vile et al. | |
| 6,480,987 B1 | * | 11/2002 | McBride .............. | 716/5 |
| 6,509,883 B1 | | 1/2003 | Foti et al. | |
| 6,637,014 B2 | * | 10/2003 | Casavant ............. | 716/6 |
| 6,675,365 B2 | * | 1/2004 | Elzinga ............... | 716/6 |
| 6,732,065 B1 | * | 5/2004 | Muddu ................ | 703/2 |
| 6,777,929 B2 | | 8/2004 | Fang et al. | |
| 6,799,153 B1 | * | 9/2004 | Sirichotiyakul et al. | 703/19 |
| 6,951,001 B2 | * | 9/2005 | Chen .................. | 716/5 |
| 6,988,255 B2 | * | 1/2006 | Allen et al. .......... | 716/6 |
| 7,017,130 B2 | * | 3/2006 | Lee et al. ............ | 716/5 |
| 2002/0188577 A1 | * | 12/2002 | Vidhani et al. ....... | 706/14 |
| 2004/0034840 A1 | * | 2/2004 | Chen .................. | 716/6 |
| 2005/0270082 A1 | * | 12/2005 | Wang et al. .......... | 327/365 |
| 2006/0059446 A1 | * | 3/2006 | Chen et al. .......... | 716/6 |
| 2006/0101135 A1 | * | 5/2006 | Li ...................... | 709/223 |

OTHER PUBLICATIONS

Quint et al., "A simplified cross coupling model for multiple balanced transmission lines", Jun. 1-4, 2004, Electronic Components and Technology Conference, 2004. Proceedings. 54th, vol. 1, pp. 255-258 vol. 1.*

(Continued)

*Primary Examiner*—Jack Chiang
*Assistant Examiner*—Helen Rossoshek

(57) ABSTRACT

Systems and methods for simulating signal coupling in electronic devices are disclosed. In an exemplary implementation a computer program product executes a computer process to simulate a victim signal having a toggling bit pattern relative to a quiet culprit signal. The process also simulates a culprit signal having a toggling bit pattern relative to a quiet victim signal. The computer process generates test results for each simulation and combines the test results to determine effects of signal coupling in an electronic device.

17 Claims, 7 Drawing Sheets

OTHER PUBLICATIONS

Quan et al., "Simulation of a coupled signal and power delivery system in an electronics package", May 28-31, 2002, Electronic Components and Technology Conference, 2002. Proceedings. 52nd, pp. 311-318.*

Kang et al.; "Noise and delay uncertainty studies for coupled RC interconnects"; Sep. 15-18, 1999; ASIC/SOC Conference, 1999. Proceedings. Twelfth Annual IEEE International; pp. 3-8.*

* cited by examiner

SYSTEMS AND METHODS OF SIMULATING SIGNAL COUPLING

TECHNICAL FIELD

The described subject matter relates to signal coupling, and more particularly to systems and methods of simulating signal coupling.

BACKGROUND

Computing systems and other electronic devices include multiple communication paths to route signals between the various system components (e.g., circuit chips). Due to space constraints, the signals are typically routed adjacent one another, causing the signals to couple during operation. Such coupling (also referred to as "cross talk") may degrade the signal quality and/or timing of the signal. Accordingly, those involved with developing computing systems and other electronic devices try to predict the amount and type of coupling that may occur during operation of the design in order to reduce the negative effects of coupling.

An approach for predicting the effects of coupling involves generating and propagating every possible signal bit pattern and timing combination that is expected during operation of an electronic device. Depending on the number of bits in the pattern and duration of each bit interval, hundreds (or even thousands) of tests may be needed to accurately predict the effects of signal coupling for the electronic device.

These tests take time to develop and run (in some cases as much as 4 hours for each test). Running the tests in parallel may reduce some of this time, but the tradeoff requires more computing resources including both the hardware and, software (e.g., additional licenses for the test software). In any event, these simulations consume time and computing resources, delaying introduction of the final product and increasing its cost.

SUMMARY

An exemplary implementation of simulating signal coupling may be implemented in a computer program product encoding a computer program for executing a computer process. The computer process may comprise: simulating a victim signal having a toggling bit pattern relative to a quiet culprit signal, simulating a culprit signal having a toggling bit pattern relative to a quiet victim signal, generating test results for each simulation, and combining the test results to determine effects of signal coupling in an electronic device.

In another exemplary implementation, simulating signal coupling in electronic devices may be implemented as a method. The method may comprise: toggling a victim signal while holding a culprit signal quiet in a first simulation, toggling the culprit signal while holding the victim signal quiet in a second simulation, combining test results of the first simulation with test results of the second simulation, and determining noise effects of signal coupling based on the combined test results.

DETAILED DESCRIPTION

Briefly, effects of coupling by a "culprit" signal on a "victim" signal may be predicted using as few as two simulations. In an exemplary implementation, one simulation toggles the victim signal while holding the culprit signal quiet. In another simulation the victim signal is held quiet while the culprit signal is toggled. Results from the two simulations may be combined to produce a coupling waveform representing a toggling victim signal with cross talk from a toggling culprit signal. The coupling data may be used to accurately predict bit pattern effects of signal coupling in an electronic device.

Additional coupling data may also be obtained without having to run any further simulations. In an exemplary implementation, the results from either or both of the original simulations may be time-shifted relative to one another and combined to determine the effect of signal timing.

The coupling data is similar, if not identical, to waveforms which may be obtained from running many tests for each possible timing and bit pattern combination. Accordingly, implementations described herein reduce simulation time and consumption of computing resources and allow the final product to be introduced faster and at a lower cost.

It is noted that operations described herein may be embodied as logic instructions on a computer-readable medium. When executed on a processor, the logic instructions cause a general purpose computing device to be programmed as a special-purpose machine that implements the described operations.

Exemplary Systems

Figure 1:
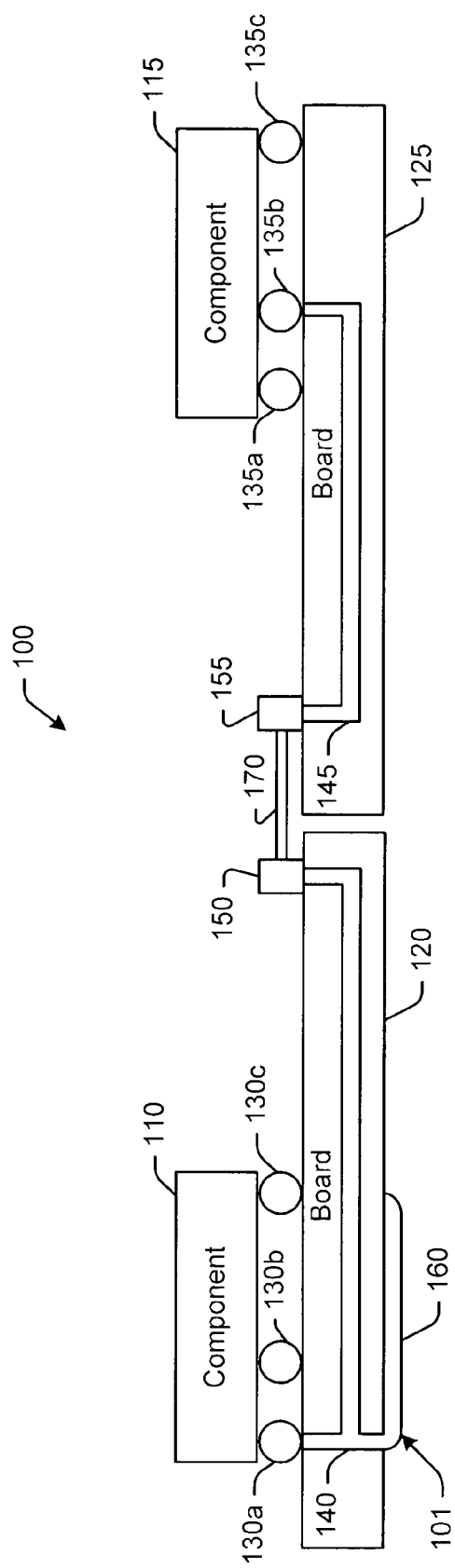
FIG. 1 is a cross-sectional illustration of an exemplary electronic device for which simulating signal coupling may be implemented.

FIG. 1 is a cross-sectional illustration of an exemplary electronic device 100 for which simulating signal coupling may be implemented. Electronic devices may include any of a wide variety of electronic circuits, including but not limited to microprocessors, integrated circuits, and logic circuits, to name only a few examples. For purposes of illustration, electronic device 100 is shown in FIG. 1 including integrated circuits 110, 115 mounted to circuit boards 120, 125 and connected to one another via a communication path 101.

Before continuing, it is noted that the subject matter described herein is not limited to electronic signals and may also be implemented in devices with optical and/or opto-electrical signals.

Communication path 101 may include any number of busses or links between the components, including but not limited to, packages, vias, printed circuit boards, cables, and connectors, to name only a few examples. Communication path 101 is illustrated in FIG. 1 between integrated circuit 110 and integrated circuit 115 as follows. Integrated circuit 110 is electrically connected to circuit board 120 at pin 130a. Via 140 provides a communication path through circuit board 120 to a connector 150 mounted on the circuit board 120. Via 140 may also provide other communication paths, e.g., to trace 160 on the opposite surface of circuit board 120. The two circuit boards are connected via a cable 170 between mating connectors 150, 155. Connector 155 is linked to integrated circuit 115 by via 145 to pin 135b.

One or more sections in the communication path 101 may route a plurality of signals adjacent one another, causing the signals to couple during operation. Such coupling may degrade the signal quality and/or signal timing (e.g., when the signal is received), and therefore it is desirable to determine bit pattern effects of signal coupling in the electronic device 100 and the effect of timing signal propagation (e.g., to reduce signal coupling).

Figure 2:
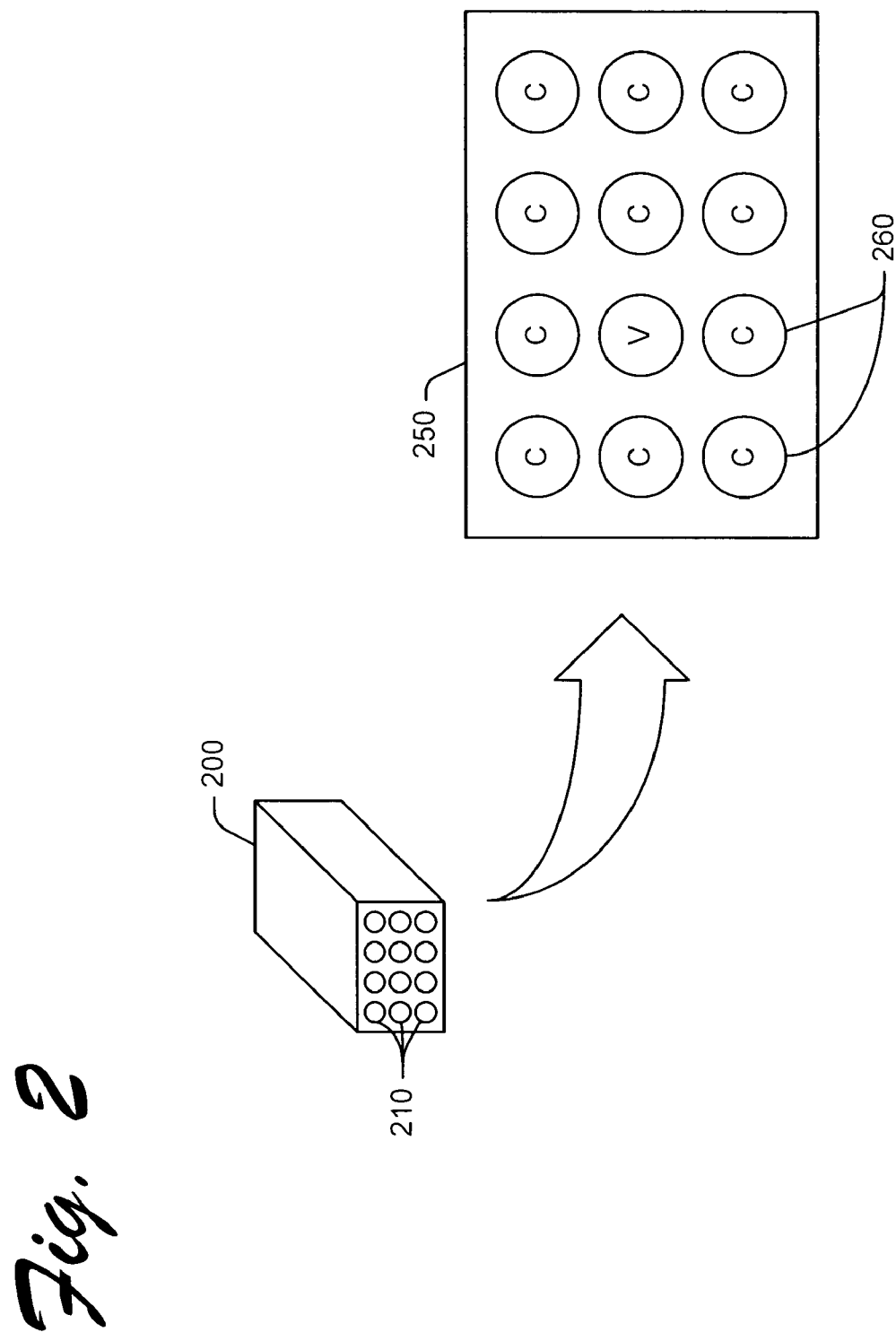
FIG. 2 illustrates an exemplary section of a communication path of an electronic device and a model for simulating signal coupling in the section.

FIG. 2 illustrates an exemplary section 200 of a communication path of an electronic device and a model 250 for simulating signal coupling in the section 200. The section 200 (such as the connectors 150, 155 or cable 170 in FIG. 1) may include a plurality of signal lines 210 routed adjacent one another. For example, as many as twelve signal lines 210 are shown routed adjacent one another in section 200.

During operation of the electronic device, one or more signal may couple with one or more adjacent signals. The signal coupling onto another signal is commonly referred to as the "culprit" (or culprit signal), and the signal which is coupled is commonly referred to as the "victim" (or victim signal).

The section 200 may be better understood with regard to model 250. Model 250 shows a plurality of signal paths 260 as these signal paths may be routed adjacent one another by section 200. Signal paths 260 are labeled as "C" for culprit and "V" for victim. The signal paths 260 may be designated as victim and culprit based on information provided by the component manufacturer or test results.

Model 250 may be implemented to simulate signal propagation in the section 200. The results may be analyzed to predict bit pattern and timing effects of coupling between victim signal(s) and culprit signal(s), as described in more detail with reference to FIGS. 3a-c.

Figure 3A:
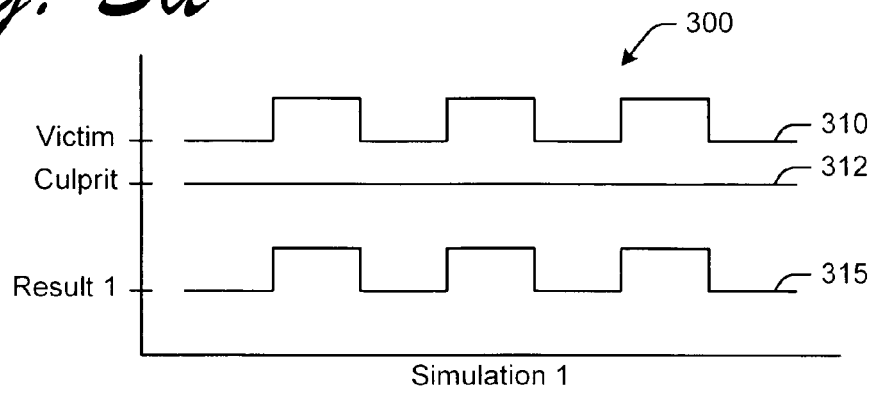
FIGS. 3a-c are exemplary waveforms for simulating signal coupling in an electronic device.
Figure 3B:
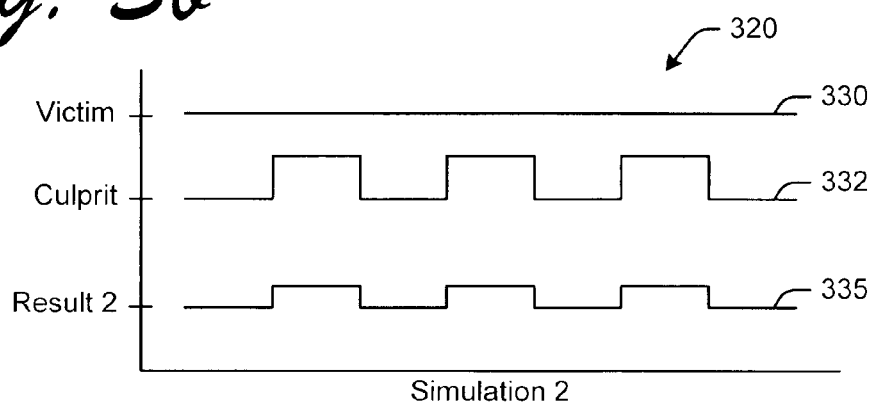
Figure 3C:
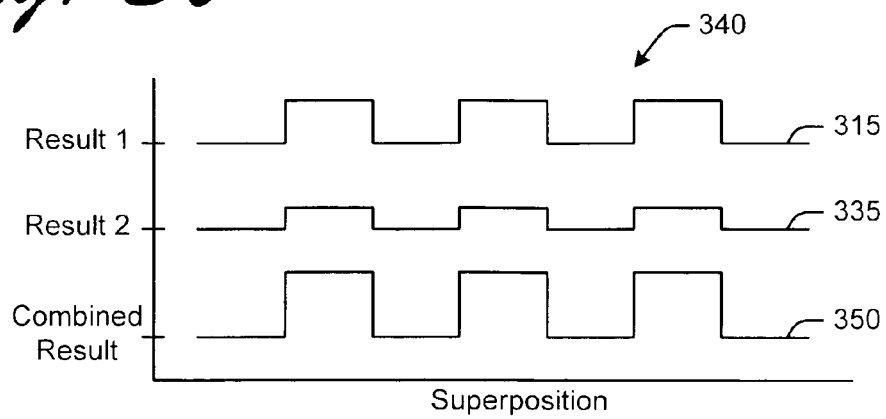

FIGS. 3a-c are exemplary waveforms for simulating signal coupling in an electronic device. Simulations may be implemented by propagating victim and culprit signals in a communication path of the electronic device, as shown in FIGS. 3a and 3b. It is noted that signal propagation may include actual testing using the electronic device, or using commercially available computer modeling software. Test results may be used to generate coupling waveforms as shown in FIG. 3c for analyzing the effects of coupling.

FIG. 3a is a plot 300 illustrating waveforms for a first simulation. The first simulation may include propagating a toggling victim signal (represented by waveform 310) while holding a culprit line quiet (represented by waveform 312). Test results (represented by waveform 315) for the first simulation include the victim signal at the end of tie communication path (e.g., at 115 in FIG. 2).

FIG. 3b is a plot 320 illustrating waveforms for a second simulation. The second simulation may include holding a victim line quiet (represented by waveform 330) while propagating a toggling culprit signal (represented by waveform 332). Test results (represented by waveform 335) for the second simulation include the victim signal at the end of the communication path (e.g., at 115 in FIG. 2). Because the victim signal is "moving around" even though it is being driven by a constant value indicates the presence of coupling in the circuit.

FIG. 3c is a plot 340 illustrating waveforms for generating coupling data (represented by waveform 350). The coupling data may be generated by combining the test results from the first simulation (represented by waveform 315 from FIG. 3a) with test results from the second simulation (represented by waveform 335 from FIG. 3b). In an exemplary implementation, the waveforms 315, 335 may be combined by super-positioning or mathematical addition of the test results to generate coupling data 350. Coupling data 350 may then be analyzed to determine the effects of coupling during operation of an electronic device.

Figure 4A:
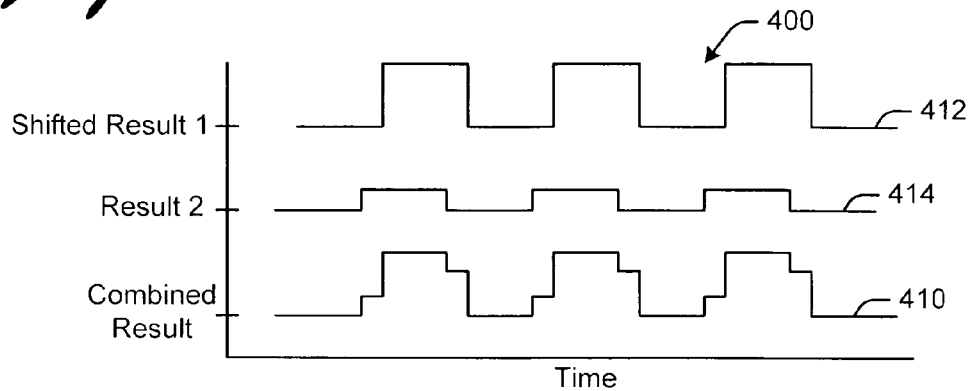
FIGS. 4a-c are more exemplary waveforms for simulating signal coupling in an electronic device.
Figure 4B:
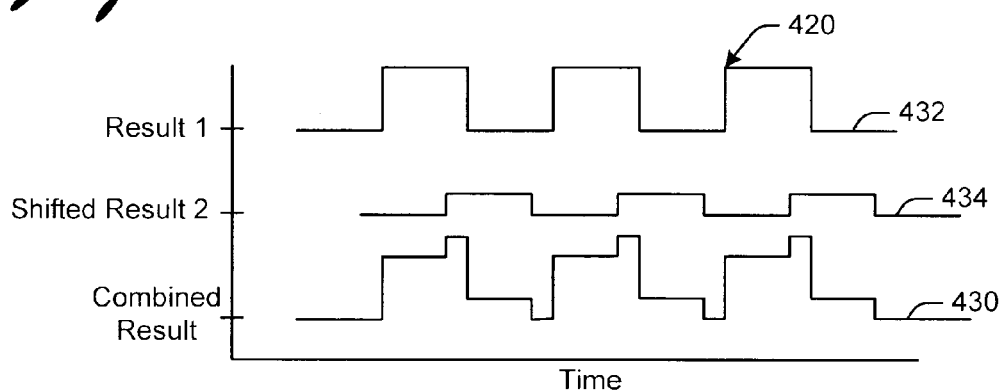
Figure 4C:
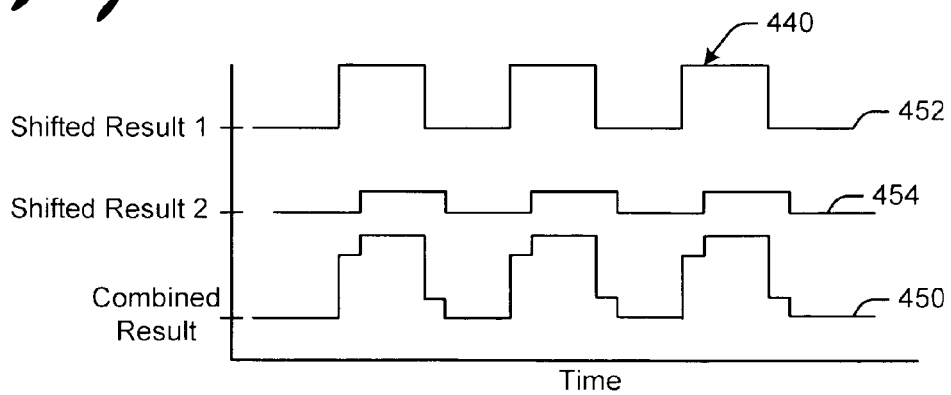

FIGS. 4a-c are more exemplary waveforms for simulating signal coupling in an electronic device. Coupling data may be obtained from the test results of the first two simulations without having to run additional simulations. In an exemplary implementation, test results may be time-shifted and combined to generate additional coupling data.

FIG. 4a is a plot 400 illustrating waveforms for generating coupling data (represented by waveform 410). The coupling data 410 may be generated by time-shifting test results from the first simulation (represented by waveform 412) and combining it with test results from the second simulation (represented by waveform 414).

FIG. 4b is a plot 420 illustrating waveforms for generating coupling data (represented by waveform 430). The coupling data 430 may be generated by time-shifting test results from the second simulation (represented by waveform 434) and combining it with test results from the first simulation (represented by waveform 432).

FIG. 4c is a plot 440 illustrating waveforms for generating coupling data (represented by waveform 450). The coupling data 450 may be generated by time-shifting the test results from the first simulation (represented by waveform 452), shifting the test results from the second simulation (represented by waveform 454), and combining it.

Again, combining test results to generate coupling data may be accomplished by super-positioning or mathematical addition. The coupling data (represented by waveforms 410, 430, and 450) may then be analyzed to determine the effects of coupling during operation of an electronic device.

The operations of combining and shifting may be implemented in program code. In an exemplary implementation, scripts may be provided for automating these implementations. Feedback may be provided to the user as waveforms and/or numerical data. In addition, data points of particular concern (e.g., unacceptable coupling) may be highlighted for the user.

It is noted that any suitable methods for time-shifting the test results (represented by waveforms in FIGS. 4a-c) may be implemented for analyzing the effects of signal coupling. In addition, the test results may be time-shifted any number of times to generate a plurality of coupling data (e.g., multiple coupling waveforms).

It is also noted that although test results is illustrated in FIGS. 3a-c and 4a-c as exemplary waveforms, the test results is not limited to waveform data. In other implementations, raw numerical data may also be used for simulating signal coupling.

It is further noted that the plots shown in FIGS. 3a-c and 4a-c are provided merely for purposes of illustration and are not necessarily representative of actual test results nor do these plots necessarily illustrate the effects of coupling. Actual test results and the effects of coupling are illustrated in FIGS. 5a-c.

Figure 5A:
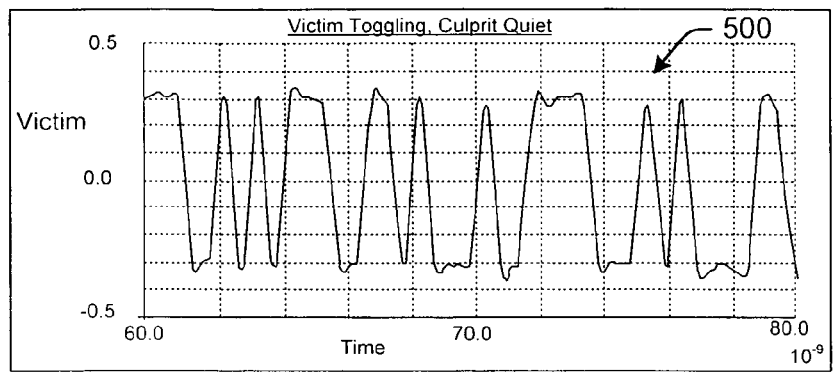
FIGS. 5a-c are illustrations of actual waveform data for simulating signal coupling in an electronic device.
Figure 5B:
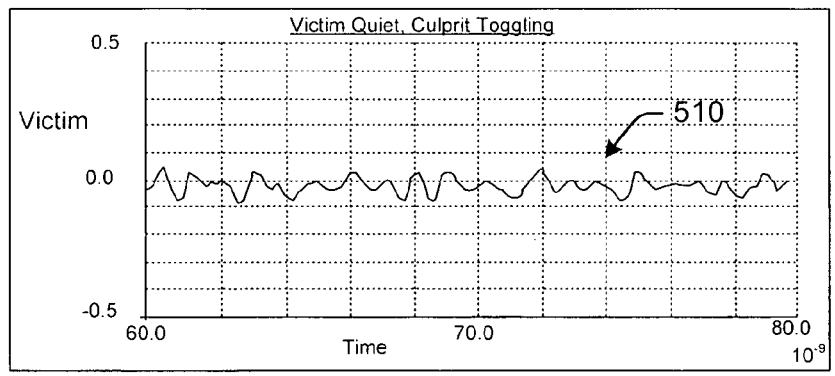
Figure 5C:
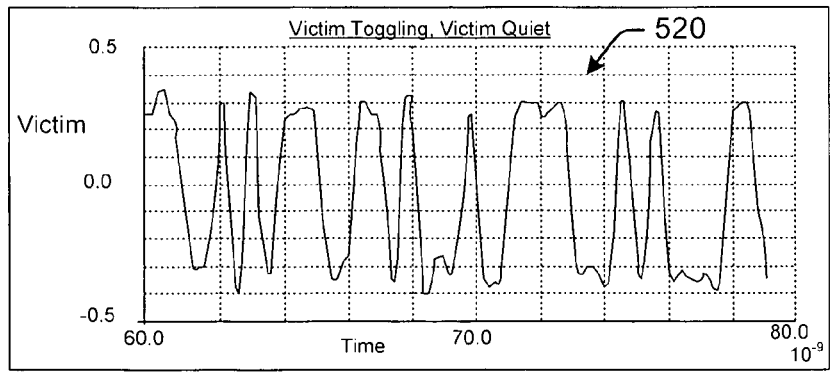

FIGS. 5a-c are illustrations of actual waveform data for simulating signal coupling in an electronic device. FIG. 5a is a plot 500 of exemplary test results obtained during a first simulation wherein a victim signal was toggled and a culprit line was held quiet. FIG. 5b is a plot 520 of exemplary test results obtained during a second simulation wherein the culprit signal was toggled and the victim line was held quiet. FIG. 5c is a plot 530 of the combined test results from FIGS. 5a and 5b showing bit pattern effects of signal coupling in an electronic device.

The results may be analyzed to determine signal quality parameters, such as, e.g., signal strength, signal quality, and timing effects. The tolerances for these signal quality parameters may be specified in order for the signals to be properly detected at the receiver (e.g., IC 155 in FIG. 1).

Signal quality parameters are typically specified by the vendor, although these parameters may also be determined experimentally during actual test operations or using computer simulation software. Generally, the signal strength should be sufficient for detecting the logic level of a signal (e.g., distinguishing between a logic 1 and a logic 0). In addition, the signal quality should be sufficient for detecting transition boundaries (e.g., transitioning from a logic 1 to a logic 0). Signal timing is also a consideration for reducing error (e.g., synchronizing the clock with the data stream).

In any event, the coupling data provided by the simulations described herein may be analyzed automatically or by manual inspection to assist designers in optimizing signal routing in electronic devices to minimize negative effects of signal coupling and/or maximize positive effects of signal coupling. In an exemplary implementation, the results may be analyzed using an "eye diagram."

Figure 6:
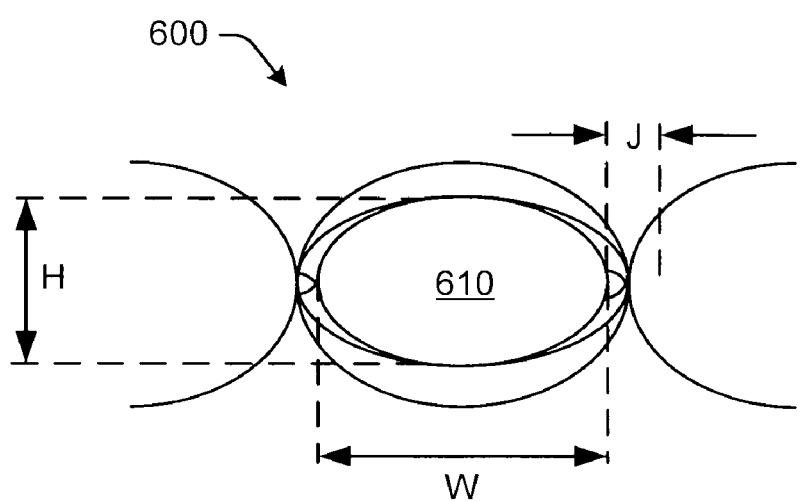
FIG. 6 is an exemplary eye diagram which may be implemented to analyze the effects of signal coupling in an electronic device.

FIG. 6 is an exemplary eye diagram 600, such as may be generated for analysis of coupling effects. Eye diagram 600 may be generated by superimposing a plurality of signals on one another to show the effects of varying signal quality and signal timing during operation. The eye diagram 600 may also be measured to determine whether signal quality parameters are within the specified tolerances. For example, the "eye opening" 610 may be measured to determine height (H), width (W), and jitter (J) present in the data stream. An eye opening 610 having a large H, large W, and minimal J may be considered optimal.

Signal coupling may result in variations to the H, W, or J of a signal. By way of example, signal coupling may be beneficial. For example, a culprit having a logic one may amplify and thereby enhance the logic one of its victim (e.g., increasing H). Likewise, a culprit having a logic zero may reduce the noise and thereby enhance the logic zero of its victim. However, coupling may also be detrimental. For example, a culprit having a logic one may amplify the logic zero of its victim. Likewise, a culprit having a logic zero may degrade the logic one of its victim (e.g., decreasing H).

The simulation results (e.g., the eye diagram) may be analyzed (e.g., by program code or software) to determine whether the signal coupling enhances or degrades signal quality for both culprit and victim signals. Analysis may also include identifying the best case bit patterns of the culprit and victim relative to one another. The simulation results may then be applied to the design phase of electronic device development to determine positioning of the culprit and victim lines in a component to enhance operation of the electronic device. The simulation results may also be used to predict optimal signal timing.

It is noted that the exemplary implementations discussed above are provided for purposes of illustration. Still other implementations are also contemplated.

Exemplary Operations

Figure 7:
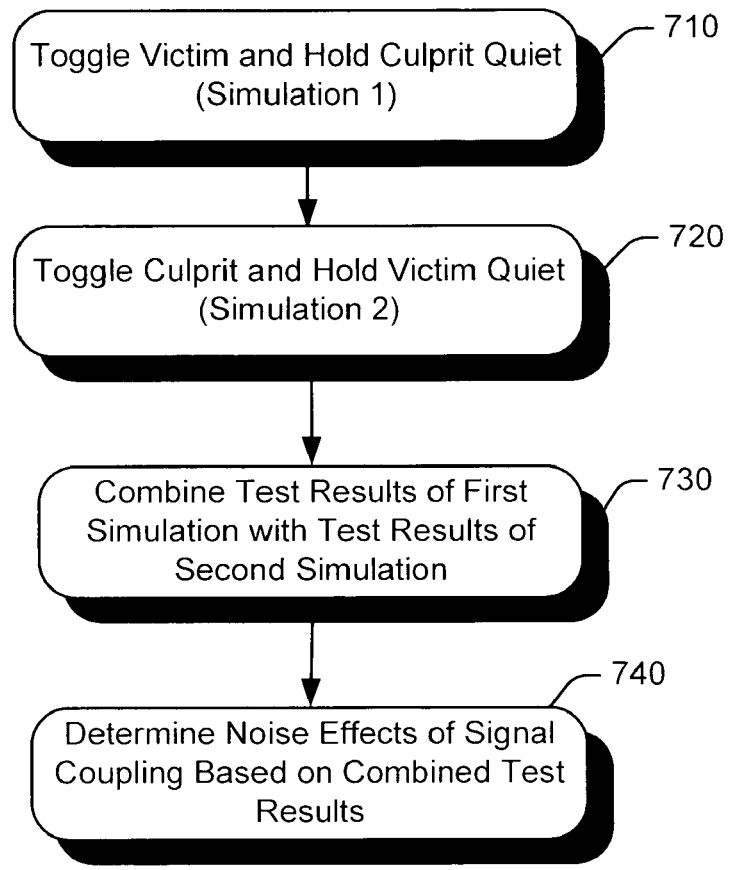
FIG. 7 is a flowchart illustrating exemplary operations to simulate signal coupling.

FIG. 7 is a flowchart illustrating exemplary operations to simulate signal coupling. Operations 700 may be embodied as logic instructions on one or more computer-readable medium. When executed on a processor, the logic instructions cause a general purpose computing device to be programmed as a special-purpose machine that implements the described operations. In an exemplary implementation, the components and connections depicted in the figures may be used to simulate signal coupling.

In operation 710 a first simulation may be run wherein the victim signal is toggled and the culprit signal is held quiet. In operation 720 a second simulation may be run wherein the victim signal is held quiet and the culprit signal is toggled. It is noted that operations 710 and 720 do not need to be performed in any particular order (e.g., Simulation 1 and Simulation 2). Indeed, the simulations may even be run simultaneously. In operation 730 the test results of the first simulation are combined with the test results of the second simulation, e.g., to generate a coupling data. In operation 740, noise effects of signal coupling are determined based on the combined test results from operation 730.

In other exemplary implementations, operations may further include time-shifting the test results of the first simulation relative to the test results of the second simulation before operation 730. Timing effects of signal coupling may then be determined based on the combined time-shifted results. The operations of time-shifting and combining may also be repeated to obtain noise effects of signal coupling for a plurality of different signal couplings.

In still other exemplary implementations, operations may further include time-shifting the test results of the second simulation relative to the test results of the first simulation before operation 730. Timing effects of signal coupling may then be determined based on the combined time-shifted results. Again, the operations of time-shifting and combining may also be repeated to obtain noise effects of signal coupling for a plurality of different signal couplings.

In yet other exemplary implementations, operations for determining noise effects may include finding best case timing of the culprit signal relative to the victim signal based on the combined test results. Operations for determining noise effects may also include finding best case bit pattern of the culprit relative to the victim based on the combined test results.

The operations shown and described herein are provided to illustrate exemplary implementations of simulating signal coupling. As mentioned above, the operations are not limited to the ordering shown and still other operations may also be implemented.

The invention claimed is:

1. A computer program product encoding a computer program for executing a computer process comprising:
   simulating a victim signal having a toggling bit pattern relative to a quiet culprit signal and generating a first test result indicating no effects of signal coupling on the victim signal;
   simulating a culprit signal having a toggling bit pattern relative to a quiet victim signal and generating a second test result indicating effects of signal coupling on the victim signal;
   time-shifting the test results to identify coupling effects without needing additional simulations; and
   combining the time-shifted test results to determine effects of signal coupling in an electronic device.

2. The computer program product of claim 1 wherein the computer process further comprises repeating the processes of time-shifting the test results and combining time-shifted to determine timing effects on signal coupling.

3. The computer program product of claim 1 wherein the computer process further comprises determining noise effects of signal coupling in an electronic device based on the combined time-shifted test results.

4. The computer program product of claim 1 wherein the computer process further comprises determining timing effects of signal coupling in an electronic device based on the combined time-shifted test results.

5. The computer program product of claim 1 wherein the computer process further comprises identifying a best case timing of the culprit relative to the victim based on the combined time-shifted test results.

6. The computer program product of claim 1 wherein the computer process further comprises identifying a best case timing of the victim relative to the culprit based on the combined time-shifted test results.

7. The computer program product of claim 1 wherein the computer process further comprises identifying a best case bit pattern of the culprit relative to the victim based on the combined time-shifted test results.

8. The computer program product of claim 1 wherein the computer process further comprises identifying a best case bit pattern of the victim relative to the culprit based on the combined time-shifted test results.

9. A method of simulating signal coupling in electronic devices comprising:
 toggling a victim signal while holding a culprit signal quiet in a first simulation to generate a first test result with no effects of signal coupling on the victim signal;
 toggling the culprit signal while holding the victim signal quiet in a second simulation to generate a second test result with effects of signal coupling on the victim signal;
 combining first and second test results of the first simulation with test results of the second simulation;
 determining noise effects of signal coupling based on the combined test results;
 time-shifting the test results of the first simulation relative to the test results of the second simulation before the operation of combining; and
 determining noise effects of signal coupling based on the combined time-shifted test results.

10. The method of claim 9 further comprising repeating the operations of shifting and combining the first time-shifted and second time-shifted test results to determine timing effects for a plurality of different signal couplings.

11. The method of claim 9 further comprising:
 time-shifting the test results of the second simulation relative to the test results of the first simulation before the operation of combining; and
 determining timing effects of signal coupling based on the combined time-shifted test results.

12. The method of claim 11 further comprising repeating the operation of shifting and the operation of combining time-shifted to determine timing effects for a plurality of different signal couplings.

13. The method of claim 9 wherein determining noise effects includes finding best case timing of the culprit relative to the victim based on the combined time-shifted test results.

14. The method of claim 9 wherein determining noise effects includes finding best case bit pattern of the culprit relative to the victim based on the combined time-shifted test results.

15. A system for simulating signal coupling in electronic devices, comprising:
 means for generating a first waveform for a toggling victim signal relative to a quiet a culprit signal;
 means for generating a second waveform for a toggling culprit signal relative to a quiet a victim signal;
 means for shifting the first and second waveforms relative to one another; and
 means for determining effects of signal coupling based on a combination of the first time-shifted and second time-shifted waveforms without needing any additional simulations.

16. The system of claim 15 further comprising means for combining the first time-shifted and second time-shifted waveforms.

17. The system of claim 15 wherein the means for determining effects of signal coupling identifies noise effects and timing effects based on the combination of the first time-shifted and second time-shifted waveforms.

* * * * *

UNITED STATES PATENT AND TRADEMARK OFFICE
CERTIFICATE OF CORRECTION

PATENT NO. : 7,370,300 B2 Page 1 of 1
APPLICATION NO. : 10/984245
DATED : May 6, 2008
INVENTOR(S) : Clark D. Burnside et al.

It is certified that error appears in the above-identified patent and that said Letters Patent is hereby corrected as shown below:

In column 3, line 54, delete "tie" and insert -- the --, therefor.

In column 6, line 65, in Claim 2, insert -- test results -- before "to".

In column 7, line 39, in Claim 9, delete "noise" and insert -- timing --, therefor.

In column 8, line 11, in Claim 12, after "time-shifted" insert -- test results --.

Signed and Sealed this

Fifth Day of August, 2008

JON W. DUDAS
*Director of the United States Patent and Trademark Office*